United States Patent
Lin et al.

(10) Patent No.: US 7,664,843 B2
(45) Date of Patent: Feb. 16, 2010

(54) DISTRIBUTED MANAGED ENTITIES AND DATABASE

(75) Inventors: Janet Lin, Lexington, MA (US); Joel Scott Bates, Garland, TX (US); Junjie Chen, Cedar Knolls, NJ (US); Kevin Corley, McKinney, TX (US); Naviit Brar, Richardson, TX (US); Zafrir Babin, Glen Rock, NJ (US)

(73) Assignee: Fujitsu Limited, Kawasaki (JP)

( * ) Notice: Subject to any disclaimer, the term of this patent is extended or adjusted under 35 U.S.C. 154(b) by 415 days.

(21) Appl. No.: 11/637,842

(22) Filed: Dec. 13, 2006

(65) Prior Publication Data

US 2007/0201487 A1 Aug. 30, 2007

Related U.S. Application Data

(60) Provisional application No. 60/749,577, filed on Dec. 13, 2005.

(51) Int. Cl.
*G06F 15/16* (2006.01)
*G06F 12/00* (2006.01)
(52) U.S. Cl. ...................... 709/223; 709/250
(58) Field of Classification Search ............... 709/223, 709/224, 225, 226, 229, 250
See application file for complete search history.

(56) References Cited

U.S. PATENT DOCUMENTS

| | | | |
|---|---|---|---|
| 4,720,850 A | 1/1988 | Oberlander et al. | |
| 5,812,528 A | 9/1998 | VanDervort | |
| 6,671,818 B1 * | 12/2003 | Mikurak ........................ | 714/4 |
| 6,789,191 B1 * | 9/2004 | Lapstun et al. .............. | 713/168 |
| 6,985,467 B2 | 1/2006 | Lomp et al. | |
| 7,020,111 B2 | 3/2006 | Ozluturk et al. | |
| 7,085,281 B2 | 8/2006 | Thomas et al. | |
| 7,133,415 B2 | 11/2006 | Zelig | |
| 7,245,628 B2 | 7/2007 | Shi et al. | |
| 7,283,519 B2 | 10/2007 | Girard | |
| 7,376,136 B2 | 5/2008 | Song | |
| 7,403,477 B2 | 7/2008 | Takeuchi | |
| 7,492,719 B2 | 2/2009 | Lim | |
| 2003/0091267 A1 * | 5/2003 | Alvarez et al. ................ | 385/16 |
| 2004/0064351 A1 * | 4/2004 | Mikurak ........................ | 705/7 |
| 2004/0107169 A1 * | 6/2004 | Lowe ........................... | 705/59 |
| 2004/0190548 A1 | 9/2004 | Harel | |
| 2004/0202470 A1 | 10/2004 | Lim | |
| 2005/0008013 A1 | 1/2005 | Jamieson | |
| 2005/0013314 A1 | 1/2005 | Lim | |

(Continued)

OTHER PUBLICATIONS

International Search Report and a Written Opinion issued on Oct. 31, 2008 in the corresponding International PCT/US2006/047374 application.

*Primary Examiner*—Zarni Maung
(74) *Attorney, Agent, or Firm*—Hanify & King, PC

(57) ABSTRACT

A system and method for providing a technique by which currently available MCUs can handle the large amounts of information present in a large GPON network, without adding expense and complexity to the network elements. A system for managing a telecommunications network comprises a control unit controlling a plurality of components of an optical telecommunications network, a plurality of components of the optical telecommunications network, each component comprising at least one managed entity of the optical telecommunications network, and a database comprising information relating to the managed entities, wherein the database is distributed across the control unit and the plurality of components of the optical telecommunications network.

11 Claims, 6 Drawing Sheets

U.S. PATENT DOCUMENTS

| | | |
|---|---|---|
| 2005/0099949 A1 | 5/2005 | Mohan |
| 2005/0198247 A1* | 9/2005 | Perry et al. ................. 709/223 |
| 2006/0098578 A1* | 5/2006 | Mallya et al. ............... 370/242 |
| 2006/0209825 A1 | 9/2006 | Carroll et al. |
| 2007/0025370 A1 | 2/2007 | Ghasem et al. |
| 2007/0070997 A1 | 3/2007 | Weitz et al. |
| 2007/0109974 A1 | 5/2007 | Cutillo et al. |

* cited by examiner

Fig. 6

| SECONDARY DATABASE CONDITION | | PRIMARY DATABASE CONDITION | | | |
|---|---|---|---|---|---|
| | | DB VALID=F SIG MATCH=F | DB VALID=F SIG MATCH=T | DB VALID=T SIG MATCH=F | DB VALID=T SIG MATCH=T |
| | DB VALID=F REINSERT=F | ALARM DBCOR 0 | ALARM DBCOR 1 | ALARM SIG MISMATCH 2 | PRI -> SEC DB 3 |
| | DB VALID=F REINSERT=T | ALARM DBCOR 4 | ALARM DBCOR 5 | PRI -> SEC DB 6 | PRI -> SEC DB 7 |
| | DB VALID=T REINSERT=F | SEC -> PRI DB 8 | SEC -> PRI DB 9 | SEC -> PRI DB 10 | SEC -> PRI DB 11 |
| | DB VALID=T REINSERT=T | SEC -> PRI DB 12 | SEC -> PRI DB 13 | ALARM SIG MISMATCH 14 | PRI -> SEC DB 15 |

DISTRIBUTED MANAGED ENTITIES AND DATABASE

CROSS-REFERENCE TO RELATED APPLICATIONS

This application claims the benefit of provisional application No. 60/749,577, filed Dec. 13, 2005, the entirety of which is incorporated herein by reference.

BACKGROUND OF THE INVENTION

1. Field of the Invention

The present invention relates to a system and method for providing a technique by which currently available MCUs can handle the large amounts of information present in a large GPON network, without adding expense and complexity to the network elements.

2. Background of the Prior Art

A Master Control Unit (MCU) is a computer system that is commonly used to control network elements in telecommunications networks, such as optical telecommunications networks. Popular optical network technologies include synchronous optical networks and passive optical networks. Common synchronous optical networking technologies include SONET and SDH technologies. Synchronous networking requires that the exact rates that are used to transport the data are tightly synchronized across the entire network. A Passive Optical Network (PON) is a point-to-multipoint, fiber to the premises network architecture in which unpowered optical splitters are used to enable a single optical fiber to serve multiple premises, typically 32. A PON includes network elements, such as an Optical Line Termination (OLT) at the service provider's central office and a number of Optical Network Units (ONUs) near end users. There are a number of standard types of PON that have been implemented. ATM Passive Optical Network (APON) was the first Passive optical network standard. It was used primarily for business applications, and was based on ATM. Broadband PON (BPON) is a standard based on APON. It adds support for WDM, dynamic and higher upstream bandwidth allocation, and survivability. Gigabit PON (GPON) is an evolution of BPON. It supports higher rates, enhanced security, and choice of Layer 2 protocol (ATM, GEM, Ethernet).

The network elements in such synchronous and passive optical networks include MCUs that control the operation of the element. Typically, information about the network entities that are managed by each network element are stored in a database controlled by the MCU of the network element. However, currently available MCUs do not have enough memory to support both current SONET features and a large GPON model, which may include up to 10 OLTs, 2560 ONTs, and thousands of T1s, voice ports, LAN ports, etc.

A need arises for a technique by which currently available MCUs can handle the large amounts of information present in a large GPON network, without adding expense and complexity to the network elements.

SUMMARY OF THE INVENTION

The present invention provides a technique by which currently available MCUs can handle the large amounts of information present in a large GPON network, without adding expense and complexity to the network elements. The necessary information, such as the CMIB and database of Managed Entities (MEs) is distributed across the MCUs and GPON Service Units (GPONSUs) in the network. The Managed Entities (MEs) for GPON features will reside on the GPONSU. Existing SONET MEs will stay on the MCU. The database record for each ME will reside on the card with the ME.

A system for managing a telecommunications network comprises a control unit controlling a plurality of components of an optical telecommunications network, a plurality of components of the optical telecommunications network, each component comprising at least one managed entity of the optical telecommunications network, and a database comprising information relating to the managed entities, wherein the database is distributed across the control unit and the plurality of components of the optical telecommunications network.

A portion of the database that is on the control unit comprises a plurality of proxy entries, each proxy entry relating to a managed entity, wherein each proxy entry points to an entry, in a portion of the database that is on a component of the optical telecommunications network, relating to the managed entity. A portion of the database that is on the component of the optical telecommunications network comprises a plurality of entries, each entry relating to a managed entity on the component of the optical telecommunications network. The control unit is operable to, upon receipt of a request directed to a managed entity, obtain an entry in a portion of the database that is on the control unit related to the managed entity and to send the request to an entry relating to the managed entity on a component of the optical telecommunications network.

BRIEF DESCRIPTION OF THE DRAWINGS

FIG. 6 is an exemplary diagram of a restart matrix.

DETAILED DESCRIPTION OF THE PREFERRED EMBODIMENTS

The present invention provides distribution of the CMIB and database across the MCUs and GPONSUs in the network. The Managed Entities (MEs) for GPON features will reside on the GPONSU. Existing SONET MEs will stay on the MCU. The database record for each ME will reside on the card with the ME.

Figure 1:
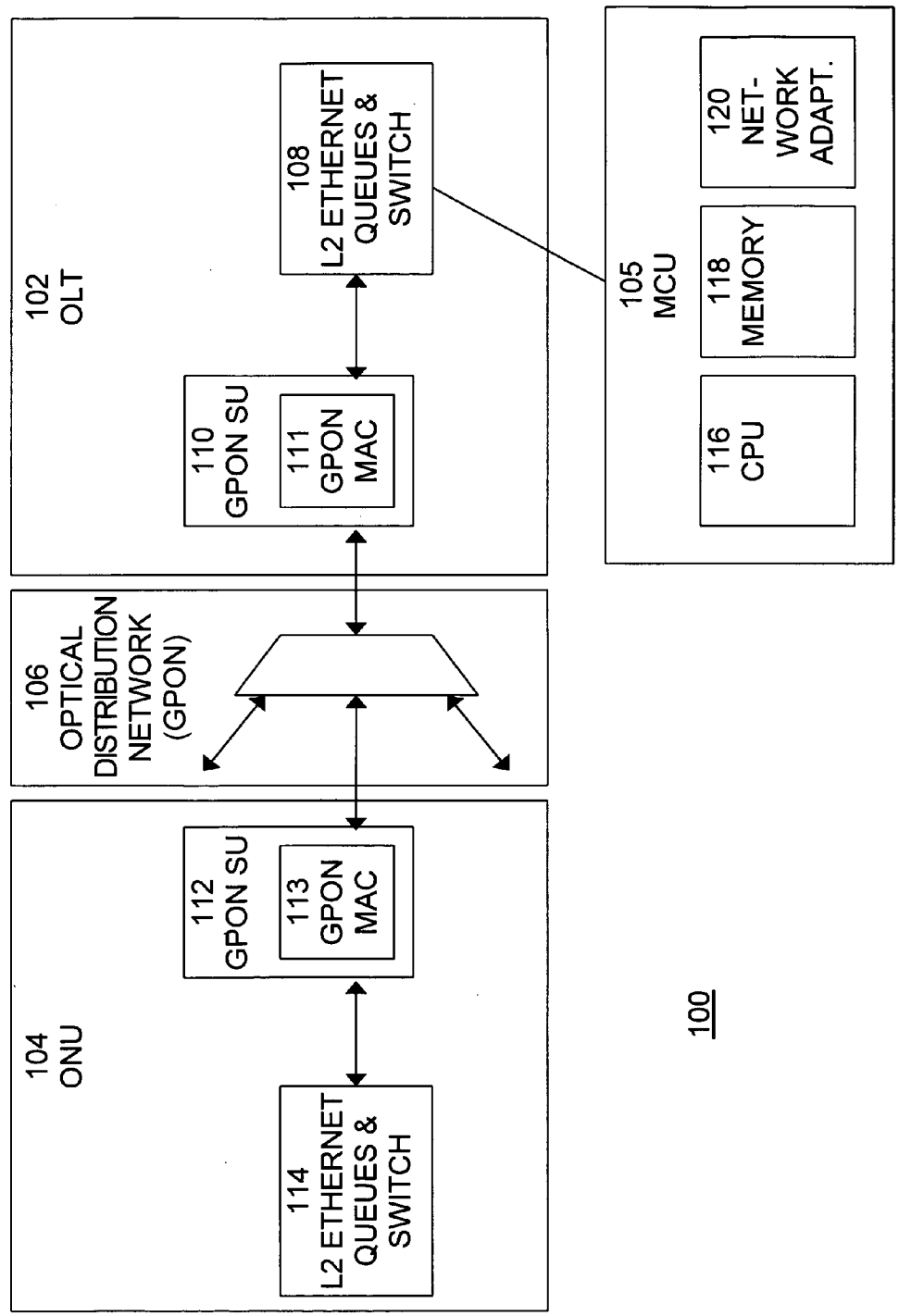
FIG. 1 is an exemplary block diagram of an optical network unit, in which the present invention may be implemented.

A block diagram of a system 100 in which the present invention may be implemented is shown in FIG. 1. System 100 includes one or more Optical Line Terminations (OLTs), such as OLT 102, one or more Optical Network Units (ONUs), such as ONU 104, one or more Micro-Controller Units (MCUs), such as MCU 105, and an optical distribution network 106. Optical distribution network 106 is typically a passive optical network, such as a GPON. An OLT, such as OLT 102, provides an interface between one or more other distribution networks (not shown) and network 106 and provides an interface for data to be transmitted over the GPON 106. For example, OLT 102 may provide an interface between a SONET network (not shown) and a GPON 106. GPON 106 is typically connected to multiple ONUs 104. The ONU provides the interface between the customer's data, video, and telephony networks (not shown) and the GPON 106. The primary function of the ONU is to receive traffic in an optical format and convert it to the customer's desired format.

In the example shown in FIG. 1, OLT 102 includes one or more Layer 2 (L2) Ethernet queues and switch 108, which handles data traffic between other connected distribution networks (not shown) and GPON 106. Ethernet queues and switch 108 communicates with GPON 106 via GPON Service Unit (SU) 110. GPON SU 110 provide communication with optical communications networks, such as GPON 106. GPON SU 110 includes Media Access Control block (MAC) 111. The MAC data communication protocol sub-layer is the part of the seven-layer OSI model data link layer (layer 2). It provides addressing and channel access control mechanisms that makes it possible for several terminals or network nodes to communicate within a multipoint network, such as GPON 106. The MAC sub-layer acts as an interface between the Logical Link Control sublayer and the network's physical layer. The MAC layer provides an addressing mechanism called physical address or MAC address, which is a unique serial number assigned to each network adapter.

GPON 106 is a point-to-multipoint, fiber to the customer network architecture in which unpowered optical splitters are used to enable a single optical fiber to serve multiple customer locations. A PON configuration reduces the amount of fiber and central office equipment required compared with point to point architectures. Downstream signals are broadcast to each premises sharing a fiber. Encryption is used to prevent eavesdropping. Upstream signals are combined using a multiple access protocol, invariably time division multiple access (TDMA). The OLTs "range" the ONUs in order to provide time slot assignments for upstream communication. GPON (Gigabit PON) supports higher rates, enhanced security, and choice of Layer 2 protocol (ATM, GEM, Ethernet). It also created a standard management interface, called OMCI, between the OLT and ONU/ONT, enabling mixed-vendor networks.

ONU 104 includes GPON SU 112 and L2 Ethernet queues and switch 114, which handles data traffic between connected customer networks (not shown) and GPON 106. Ethernet queues and switch 114 communicates with GPON 106 via GPON Media Access Control block (MAC) 113 of GPON SU 112.

MCU 105 includes a processor (CPU) 116, memory 118, and network adapter 120, which provides communications with network elements, such as OLT 102.

Typically, the active components in an ONU 104 and an OLT 102 are implemented on plug-in cards, that plug-in to a motherboard or backplane, which is itself housed in a cabinet or a shelf of a cabinet. For example, GPON SU 110 may be implemented on a plug-in card. Depending upon the technology involved, a card may include only one GPON SU, or the card may include multiple GPON SUs. Likewise, one or more Ethernet switches may be included on a card, as may MCU 105. Typically, each card has only one type of circuit, such as GPON SU, Ethernet switch, or MCU, although there may be more than one instance of a type of circuit on a card. The present invention contemplates implementation in any and all systems, regardless of the arrangement of the components on cards in any quantity, mixture, or configuration.

Figure 2:
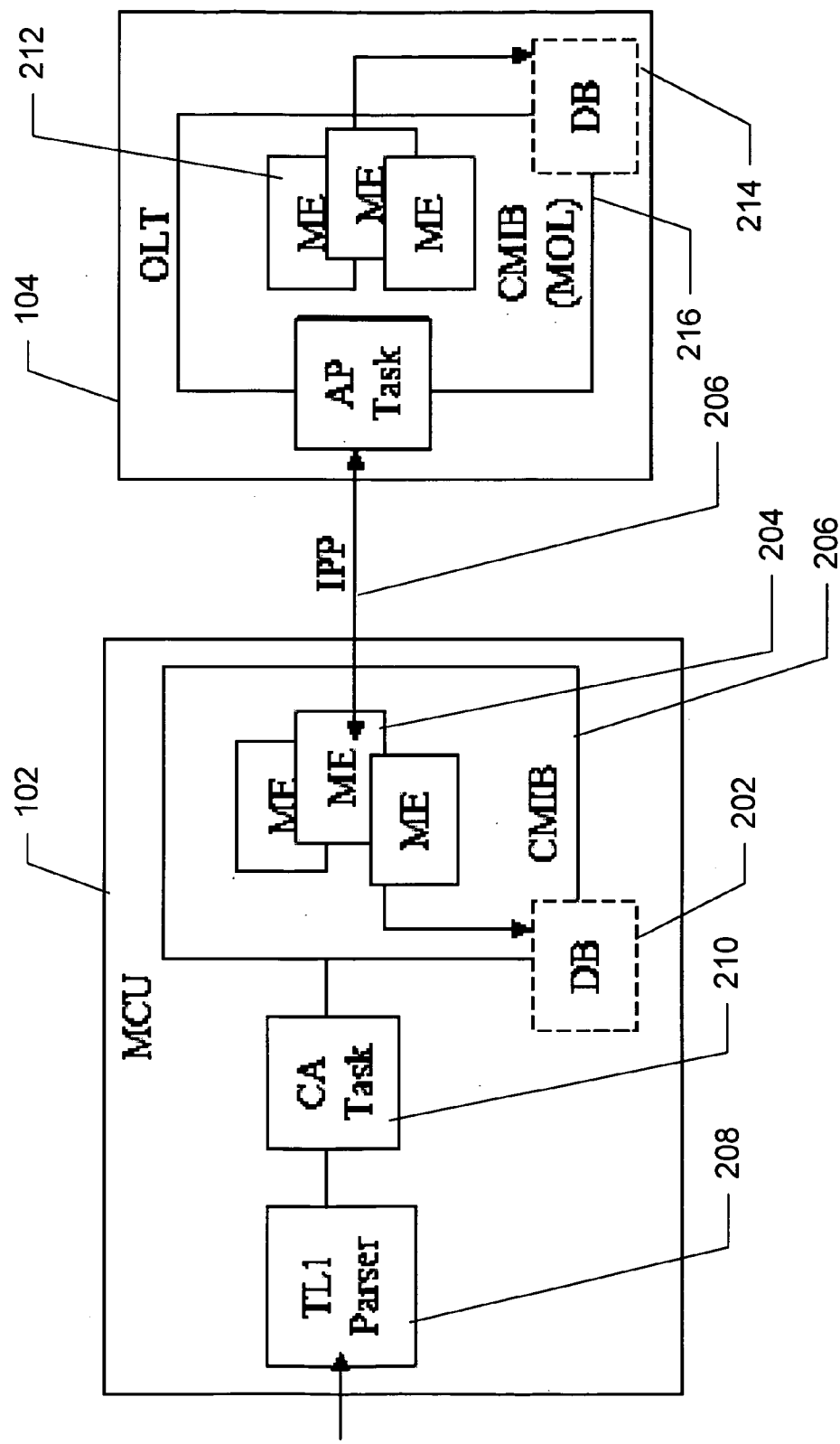
FIG. 2 is an exemplary block diagram of a system in which IP multi-cast video distribution may be implemented.

An example of logical entities in the MCU and OLT shown in FIG. 1 is shown in FIG. 2. MCU 102 includes a database 202 which stores entries known as Managed Entities (MEs) 204. MEs 204 are logical entities that represent facilities and/or services of the network(s) managed by MCU 102. MCU 102 also includes CMIB 206, which is a management engine that performs the status checking, rules checking, and updating of MEs 204. MCU 102 also includes TL1 parser 208 and CA task 210, which process incoming provisioning and maintenance commands, as well as status information, and present the processed information to CMIB 206 for processing of the MEs 204.

OLT 104 includes OLT Managed Entities (MEs) 212, which are the MEs that make up GPON 106. OLT 104 includes its own database 214, which includes the database records for the MEs 212. The CMIB engine 216 is duplicated on the OLT 104. The OLT MEs 212 do rules checking for any provisioning stored on the OLT.

Included in the MEs 204 on MCU 102 are proxy MEs for each ME 212 on the OLT 104. MCU 102 proxy MEs send inter-process packets (IPP), but do not store data in the MCU DB 208. MCU proxy MEs 204 can do rules checking based on EQPT provisioning or any database record stored on the MCU 102. MCU 102 can do list/range across OLTs using the proxy ME and the current CMIB engine. No change to the TL1 Agent/Parser Design.

The Primary DB 202 and 214 is distributed across the MCU 102 and all installed GPONSUs (not shown) in the OLT 104. The Secondary DB is distributed across the LU and FSW The MCU DB202 will keep a checksum for each of the GPON DBs. This checksum will be used at startup to validate the DB. The checksum records will be initialized to zero during a system reset. This will indicate that no GPON DB exists and the GPON portion should be built from default. In order to prevent DB corruption due to card pulls, the Secondary DB on the GPONSU will not be written inline during the transaction commit. The Order of DB writes for an GPONSU ME transaction will be: GPON Primary/GPON RAM -inline MCU Primary/MCU RAM (crc record update) GPON Secondary.

The GPONSU will evaluate a restart matrix after coldstart, similar to the MCU behavior. Examples of states in such a matrix include:

Primary Valid -including CRC match from MCU Primary
Secondary Valid -including CRC match from LU Secondary
FSW reinserted -1 value per GPONSU Signature match Installing a FSW into a shelf where there is no current FSW card, will cause the Secondary DB to be copied to the FSW by the GPONSU. (Similar to LU behavior).

DB alarms will be raised under a variety of circumstances. For example, the alarm DB corrupt will be raised if the DB at the GPONSU does not match the DB at the MCU. Such a condition may arise, for example, as a result of installing a GPONSU from another shelf into a shelf with no FSW installed. The DB alarm will lock the MCU DB and no provisioning may occur, which prevents provisioning for any other GPONSU as well. The DB corrupt condition can be cleared by removing the offending GPONSU. If the MCU coldstarts and then detects an invalid DB at the GPONSU, removing the GPONSU will not immediately clear the DB alarm. This is because the RAM DB has already been built by default and contains no provisioning. Another MCU restart will be needed to rebuild the RAM DB.

The MCU will maintain alarms for the OLT Equipment and OLTIF. The MCU will also keep a single alarm for each ONT to represent all failures at the ONT. A default database record will be created for each ONT as a placeholder for the alarm. Alarms stored at the MCU will have a consecutive ATAG, and they will report autonomously. The alarms will be stored in the MCU AO buffer and can be retrieved with standard retrieval commands. Removal of the OLT Equipment will clear the OLTIF and ONT alarms.

For reliability and availability purposes, it is important to backup the GPON Database. In the system shown in FIG. 2, the customer or user of the system sees the database as a single entity. The Database will be backed up as a single DBS file which contains the combined MCU DB and the GPON DB. The DCC will send a request to the Switch card for the GPON DB. The Switch card will generate a file, such as a TAR file, from the DBs stored on the Switch card and will make it available to the DCC. The DCC will combine the MCU DB file and the GPON DB file into a single DBS file.

The DCC will generate a file of the MCU DB from the Line Unit and place it on the DCC Ram Disk. The DCC will send a request to the Switch card for the GPON DB. The Switch card will generate a file from the DBs stored on the Switch card and place it on a file volume on the switch card. The Switch card will notify the DCC that the file is available on the Switch card RAM disk. The DCC will mount the Switch card RAM disk to access the file via NFS. The DCC will combine the MCU DB file and the GPON DB file into a single DBS file.

In order to restore the GPON Database, the DCC will receive a DBS file containing the combined MCU DB and the GPON DB. The DCC will split the MCU DB and GPON TAR files. The MCU DB will be stored on the local Ram Disk. The GPON DB will be stored on the Switch Card RAM DISK. The DCC will send a notification to the Switch Card that the GPON DB is available.

Figure 3:
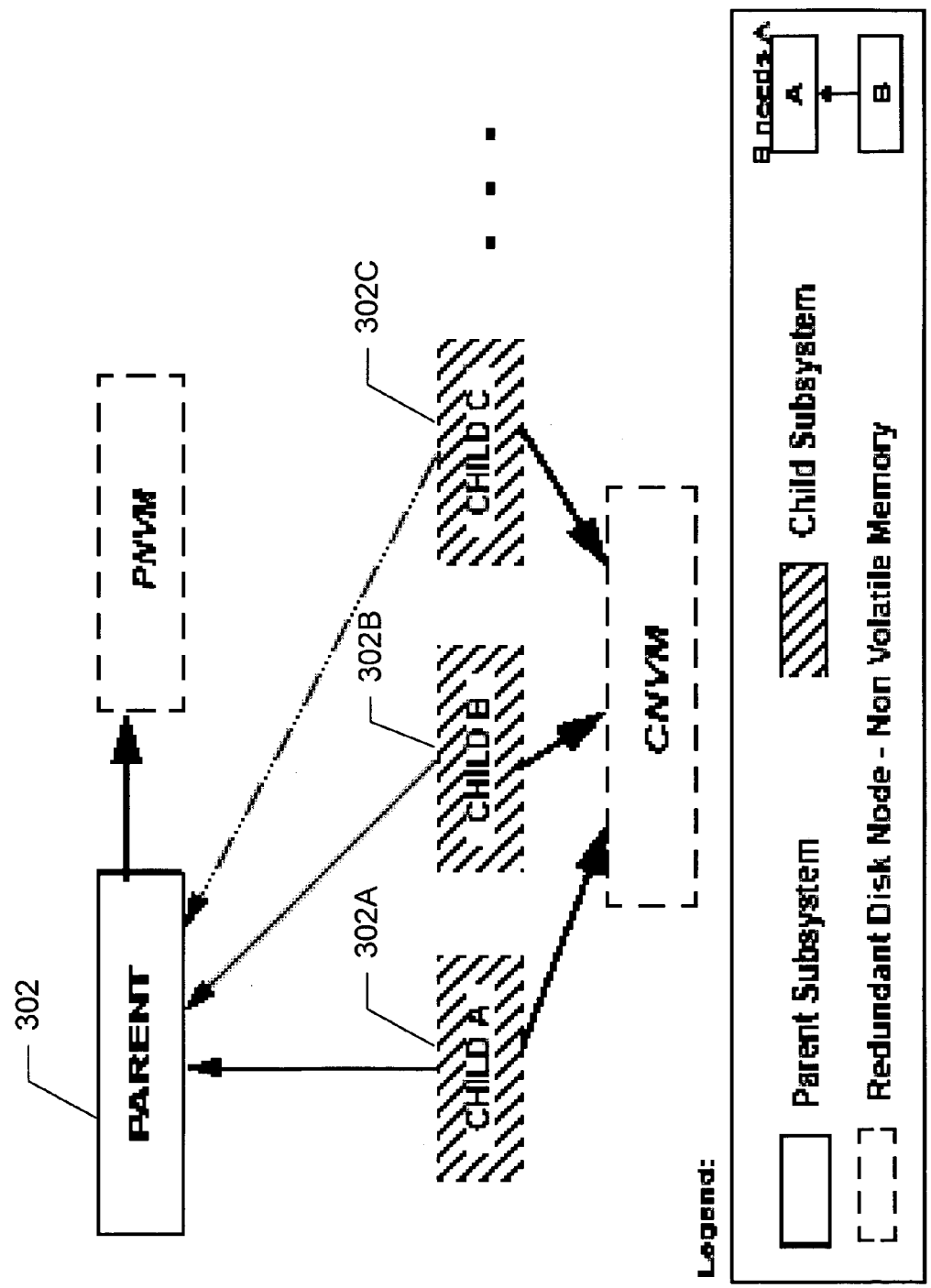
FIG. 3 is an exemplary block diagram of a system in which IP multi-cast video distribution may be implemented.

The architecture of the database itself will now be described. In the example of the architecture of the database shown in FIG. 3, the database has a single parent node 302 located on MCU 102, shown in FIG. 1, and multiple child nodes 302A-C located on one or more OLTs 104, shown in FIG. 1. The parent must be present, however a child may or may not be present. The child nodes are independent of each other. The Parent can access a secondary non-volatile memory unit on a separate card. There is a single card providing secondary non-volatile memory for all the child units.

The database will follow a Primary/Secondary model, that will be distributed across the multiple cards. The Primary database is distributed across the Parent and provisioned child service units. The Secondary database will be distributed across the two secondary NVM units. The customer will see the DB as a whole for backup and restore purposes.

Each instance of the database, be it the Primary (on the Parent/Child cards), or the Secondary (on the PNVM/CNVM cards) should be considered a matched pair. It is NOT possible to mix and match Parent DBs with Child DBs by swapping cards from different shelves or replacing cards with stale provisioning in shelves. This is due to the fact that the databases are not split across feature lines. The provisioning is mixed across the two databases depending on where the appropriate Managed Entity data is located. The Parent database does not just hold system level information and the Child hold feature related provisioning.

To facilitate this, the Parent database will create a record in its database that will contain information about each of the GPON provisioning databases. This record information will be used to validate the database as a whole. An example scenario where this is required is a Child is installed into a shelf without a CNVM card present.

The main purpose of the database is to provide data storage for Managed Entity data records. The distributed database is required because the Managed Entities are distributed across parent and child units. The Managed Entities perform operations on the database using a transaction entity that may contain several database records. The transaction is processed as a whole unit when writing or 'commit'ing the data to the primary or secondary.

The Primary database will be updated first on the parent and child unit. After the complete transaction is updated in both Primary DBs, the Secondary will be updated with the transaction. This will prevent DB corruptions in card pull scenarios where the DB in one unit has been updated and the card is pulled before the DB in the other unit is updated.

Figure 4:
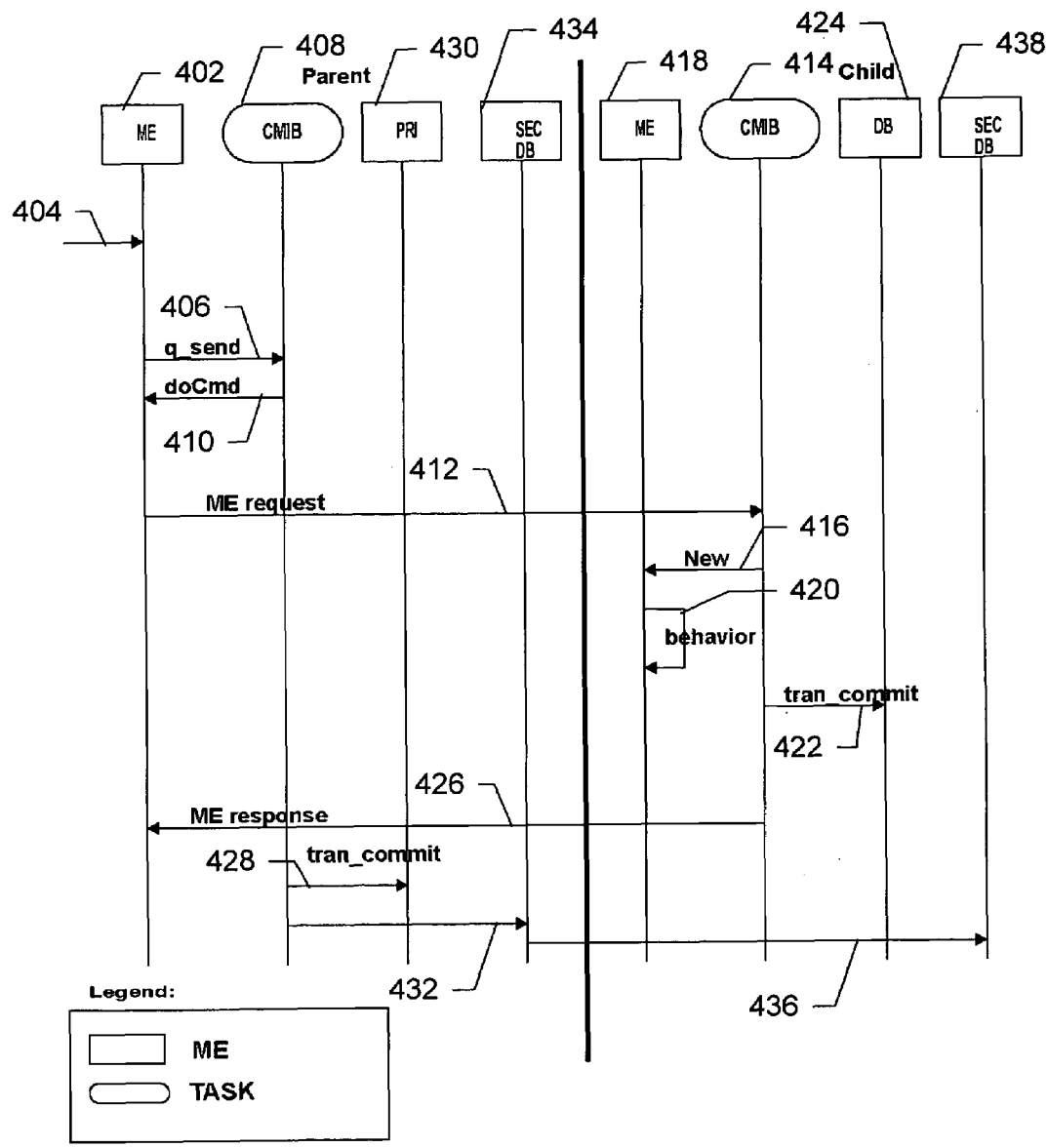
FIG. 4 is an exemplary flow diagram of transactions in a distributed database.

An example of ME interaction is shown in FIG. 4, which is an exemplary flow diagram of transactions in the distributed DB. For example, an ME 402 may receive a request 404 to perform an action. Such a request 404 is sent to the ME 402 in the parent DB on the MCU. ME 402 sends a query 406 to CMIB 408. CMIB 408 responds 410 with an indication of where ME 402 should send the request to have the command performed. ME 402 then sends an ME request 412 to the indicated location, which is a CMIB 414 located in a child database on an OLT. CMIB 414 sends a new request 416 to the ME 418 in the child database on the OLT. ME 418 then performs the requested behavior 420, and sends along any associated status information. CMIB 414 then commits 422 the transaction to the child DB 424. CMIB 414 then sends an ME response 426 back to the original ME 402, indicating completion of the behavior. CMIB 408 then commits 428 the transaction to the Primary DB 430 in the Parent, as well as committing 432 the transaction to the Secondary DB 434 in the Parent. The Secondary DB 434 in the Parent then commits 436 the transaction to the Secondary DB 438 in the Child.

Figure 5:
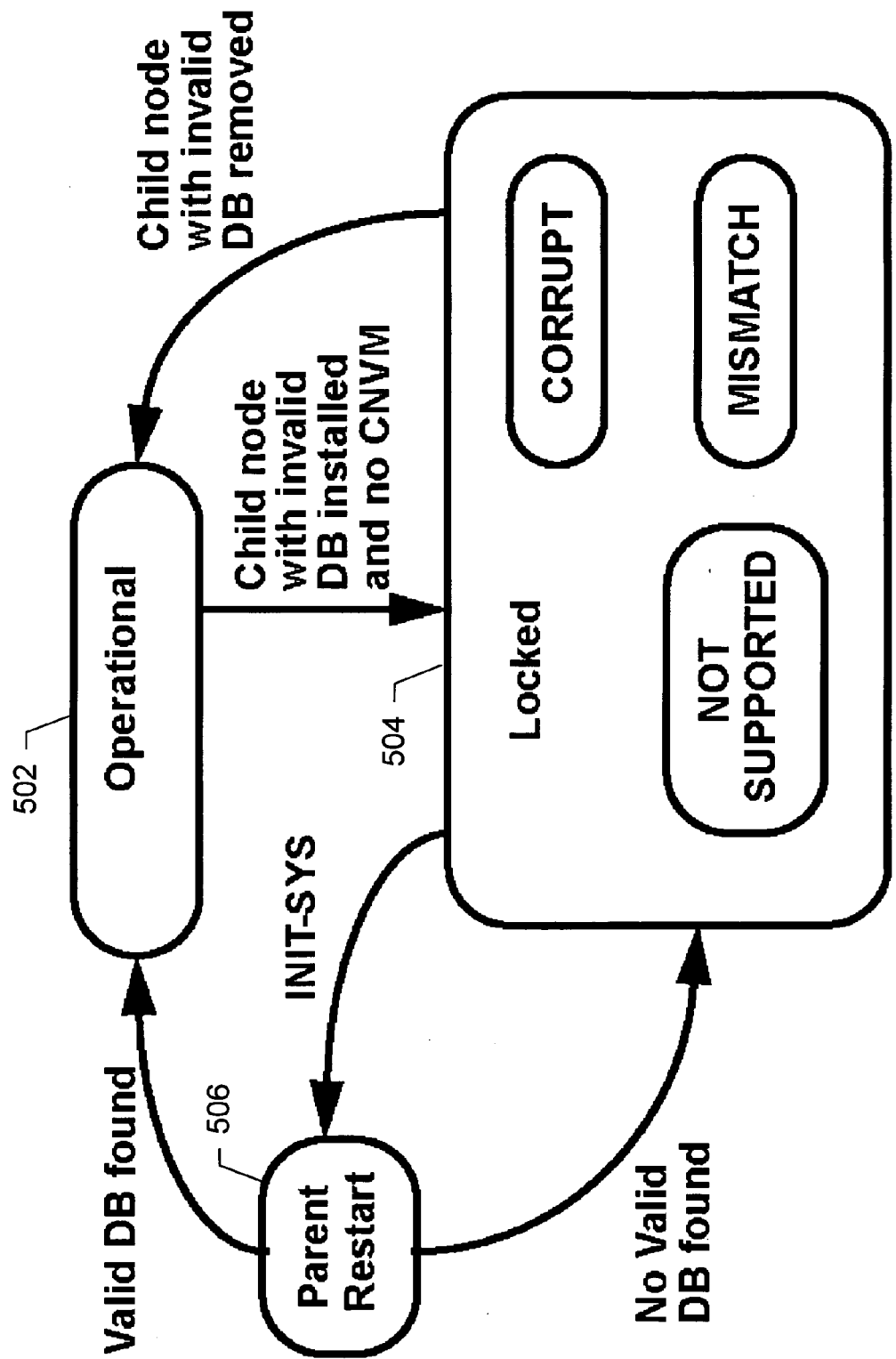
FIG. 5 is an exemplary diagram of a database state model.

An example of a database state model is shown in FIG. 5. The database has two states, Operational 502 and Locked 504. When the Parent restarts 506, the state of the database is determined using a restart matrix, such as that shown in FIG. 6. The database will be in the Operational 502 state if a valid database is found on the parent and all child nodes for either the Primary or Secondary DB. The database will be in the Locked 504 state when no valid database is found on the parent and all child nodes for either the Primary or Secondary DB. When the database is locked, no system provisioning may occur.

The database may transition from Operational 502 to Locked 504 if a child node is inserted from another system or with a stale database and no Secondary DB is available. The database will transition to Operational 502 if the offending node is removed.

Examples of database alarms that may be supported to reflect the DB condition include NONE—The database is in working order and available for reads and writes.

SIG_MISMATCH—The database on the Primary and Secondary have valid CRCs but do not correspond to each other. One of the two DBs came from another system as a result of card swapping.

DB_CORRUPT—The database is invalid. The database does not match its CRCs or no database was found on the NVM. The database is locked and not available for reads and writes.

$DB_{13}$ VER_MISMATCH—The database version does not match the current software load. The database is locked and not available for reads and writes.

NO_SDDB—The card containing the NVM has been removed. The Primary is still available and functioning. The database is available for reads and writes.

PROV_NOT_SUPPORTED—The database has detected records from a feature that is not supported in this release of software. The database is locked and not available for reads and writes.

A restart matrix will be used during card cold restarts to determine the validity and compatibility of the Primary and Secondary database and choose one for usage. The restart matrix is a series of checks that can be made and there result specifies a lookup in a table for choosing the desired database. The restart matrix is evaluated at either the Parent or the Child node, depending on where the restart occurred. Four checks are made as part of the evaluation. They are:

- Primary database is valid—This routine will check the database is valid by recalculating the database CRCs and comparing them with stored values. Returns TRUE if db is valid. Returns FALSE if db is not valid.
- Secondary database is valid—This routine will check the database is valid by recalculating the database CRCs and comparing them with stored values. Returns TRUE if db is valid. Returns FALSE if db is not valid.
- Signatures of the local DBs match—This routine will check and see if the two databases came from the same system. Returns TRUE if the signature of both DBs are equal. Returns FALSE if the signature of both DBs are not equal.
- The local NVM unit has not been reinserted—This routine is determines that the NVM unit was present in the system prior to the processor card restart. This check is to catch NVM card swaps.

Both the Parent and the Child database subsystems will have there own restart matrix to determine the source database to use at startup. If the database stored in the Child or the CNVM does not match the checksum stored in its corresponding Parent DB record, that copy will be considered invalid and will affect the restart matrix appropriately. This will ensure the Parent DB and the Child DB are a matched pair and will prevent stale Child databases from being used in card swap scenarios.

Examples of DB Sync and Restart Scenarios are described below:

| # | Scenario | Equipped Cards | Behavior |
|---|---|---|---|
| 1 | Parent Coldstart | Parent, PNVM, Child, CNVM (All Cards match) | The DB subsystem in the Parent will evaluate the restart matrix to select the PRI or SEC Parent DB. The DB subsystem will query each provisioned Child to verify the compatibility of the GPON DBs. The Parent will build its RAM DB, no DB alarms are raised and DB Replay will proceed. (Cell 11) |
| 2 | Parent Coldstart | Parent, PNVM, Child - from another shelf No CNVM | The DB subsystem in the Parent will evaluate the restart matrix to select the PRI or SEC Parent DB. The DB subsystem will query each provisioned Child to verify the compatibility of the GPON DBs. The Child from another shelf will not match the DB in the Parent causing a DB Alarm. The Parent will build its RAM DB from DEFAULT, Replay will NOT proceed. (Cell 1) |
| 3 | Parent Coldstart | Parent, PNVM, No Child, CNVM | The DB subsystem in the Parent will evaluate the restart matrix to select the PRI or SEC Parent DB. The DB subsystem will query each provisioned Child to verify the compatibility of the GPON DBs. The card missing case will NOT cause a DB alarm. The DB alarm condition will be checked at the time the Child is installed. This will allow GPON service on other slots and TDM service to continue. The Parent will build its RAM DB, no DB alarms are raised and DB Replay will proceed. (Cell 11) |
| 4 | Parent Coldstart | Parent, PNVM, No Child, No CNVM | The DB subsystem in the Parent will evaluate the restart matrix to select the PRI or SEC Parent DB. The DB subsystem will query each provisioned Child to verify the compatibility of the GPON DBs. The card missing case will NOT cause a DB alarm. The DB alarm condition will be checked at the time the Child is installed. This will allow GPON service on other slots and TDM service to continue. The Parent will build its RAM DB, no DB alarms are raised and DB Replay will proceed. (Cell 11) |
| 5 | Parent Coldstart | Parent, PNVM, Child, No CNVM | The DB subsystem in the Parent will evaluate the restart matrix to select the PRI Parent DB. The DB subsystem will query each provisioned Child to verify the compatibility of the GPON DBs. The |

| # | Scenario | Equipped Cards | Behavior |
|---|---|---|---|
| | | | Parent will build its RAM DB, no DB alarms are raised and DB Replay will proceed. The Child DB subsystem will raise an alarm for the condition of no SEC DB (Cell 3) |
| 6 | Parent Coldstart | Parent, PNVM, Stale Child, CNVM (Stale - the card was removed from this NE and placed back after some other provisioning occurred) | The DB subsystem in the Parent will evaluate the restart matrix. The DB subsystem will query each provisioned Child to verify the compatibility of the GPON DBs. The DB subsystem in the Parent will select the SEC Parent DB. The Parent will build its RAM DB, no DB alarms are raised and DB Replay will proceed. (Cell 13) |
| 7 | Parent Coldstart | Parent, PNVM, Stale Child, No CNVM | The DB subsystem in the Parent will evaluate the restart matrix. The DB subsystem will query each provisioned Child to verify the compatibility of the GPON DBs. The stale Child will not match the DB in the Parent causing a DB Alarm. The Parent will build its RAM DB from DEFAULT, Replay will NOT proceed. (Cell 1) |
| 8 | Parent Warmstart | Parent, PNVM, Child, CNVM | The Parent RAM DB is the master |
| 9 | Child Coldstart | Parent, PNVM, Child, CNVM (All Cards match) | The DB subsystem in the Child will evaluate its restart matrix to select the PRI or SEC Child DB. The DB subsystem will query the Parent to verify the compatibility of its GPON DB with the Parent. The Child will build its RAM DB, no DB alarms are raised and DB Replay will proceed. (Cell 11) |
| 10 | Child Coldstart | Parent, PNVM, Child, No CNVM | The DB subsystem in the Child will evaluate its restart matrix to select the PRI Child DB. The DB subsystem will query the Parent to verify the compatibility of its GPON DB with the Parent. The Child will build its RAM DB, no DB alarms are raised and DB Replay will proceed. (Cell 6) |
| 11 | Child Coldstart | Parent, PNVM, Child - from another shelf CNVM | The DB subsystem in the Child will evaluate its restart matrix to select the SEC Child DB. The DB subsystem will query the Parent to verify the compatibility of its GPON DB with the Parent. The Child will build its RAM DB, no DB alarms are raised and DB Replay will proceed. (Cell 12) |
| 12 | Child Coldstart | Parent, PNVM, Child - from another shelf No CNVM | The DB subsystem in the Child will evaluate its restart matrix to select the PRI Child DB. The DB subsystem will query the Parent to verify the compatibility of its GPON DB with the Parent. The Child from another shelf will not match the DB in the Parent causing a DB Alarm. The Child will build its RAM DB from DEFAULT, Replay will NOT proceed. (Cell 0) |
| 13 | Child Coldstart | Parent, PNVM, Child CNVM - from another shelf | The DB subsystem in the Child will evaluate its restart matrix to select the PRI Child DB. The DB subsystem will query the Parent to verify the compatibility of its GPON DB with the Parent. The Child will build its RAM DB, no DB alarms are raised and DB Replay will proceed. (Cell 8) |

-continued

| # | Scenario | Equipped Cards | Behavior |
|---|---|---|---|
| 14 | Child Coldstart | Parent, PNVM, Child - from another shelf CNVM - from another shelf | The DB subsystem in the Child will evaluate its restart matrix. The DB subsystem will query the Parent to verify the compatibility of its GPON DB with the Parent. The Child from another shelf will not match the DB in the Parent causing a DB Alarm. The Child will build its RAM DB from DEFAULT, Replay will NOT proceed. (Cell 4) |
| 15 | Child Coldstart | Parent, PNVM, Child - stale card CNVM | The DB subsystem in the Child will evaluate its restart matrix. The DB subsystem will query the Parent to verify the compatibility of its GPON DB with the Parent. The Child will not match the DB in the Parent. The Child will build its RAM DB from SEC, no DB alarms are raised and DB Replay will proceed. (Cell 13) |
| 16 | Child Coldstart | Parent, PNVM, Child - stale card from same shelf No CNVM | The DB subsystem in the Child will evaluate its restart matrix. The DB subsystem will query the Parent to verify the compatibility of its GPON DB with the Parent. The Child will not match the DB in the Parent. There is no SEC DB to select, causing a DBCOR Alarm. The Child will build its RAM DB from DEFAULT, Replay will NOT proceed. (Cell 0) |
| 17 | Child Coldstart | Parent, PNVM, Child - stale card CNVM - from another shelf | The DB subsystem in the Child will evaluate its restart matrix. The DB subsystem will query the Parent to verify the compatibility of its GPON DB with the Parent. The stale Child will not match the DB in the Parent causing a DB Alarm. The Child will build its RAM DB from DEFAULT, Replay will NOT proceed. (Cell 0) |
| 18 | LU1 Removed | Parent, LU2, Child, CNVM | The Parent DB subsystem will copy the database to the Line Unit and update its status as the keeper of the SEC Parent DB |
| 19 | LU1 Removed | Parent, No LU2, Child, CNVM | The Parent DB subsystem will raise an alarm for the condition of no SEC DB |
| 20 | LU1 Reinserted | Parent, LU2, Child, CNVM | No Action |
| 21 | LU1 Reinserted | Parent, No LU2, Child, CNVM | The Parent DB subsystem will copy the database to the Line Unit and update its status as the keeper of the SEC Parent DB |
| 22 | FSW1 Removed | Parent, PNVM, Child, FSW2 | The Child DB subsystem will copy the database to the CNVM and update its status as the keeper of the SEC Child DB |
| 23 | FSW1 Removed | Parent, PNVM, Child, No FSW2 | The Child DB subsystem will raise an alarm for the condition of no SEC DB |
| 24 | FSW1 Reinserted | Parent, LU2, Child, FSW2 | No Action |
| 25 | FSW1 Reinserted | Parent, LU2, Child, No FSW2 | The GPONSU DB subsystem will copy the database to the CNVM and update its status as the keeper of the SEC Child DB |

The CNVM card must be present for backup and restore operations to be performed. If a CNVM card is not installed the COPY-FILE and COPY-MEM commands will be denied.

The database backup and restore involves the following TL1 commands:

COPY-MEM to copy secondary DB to RAM disk for backup feature, or to copy RAM disk to standby DB for restore feature.

COPY-FILE to move RAM disk to a management station for backup feature, or to move file from a management station to RAM disk for restore. This is file transfer via ftp protocol if the management station is connected to LCN or craft Ethernet port, or via FTAM from X.25 port. The Ram disk combines both Parent DB and GPON DB in compressed format and stored in DCC.

INIT-SYS to restart the system so that RAM database will be constructed from standby DB for restore. We need to extend the INIT-SYS command to GPON unit so that DB can be restored from a given DB bank. Sysreset will put DB in default.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

The invention claimed is:

1. A system for managing a telecommunications network comprising:
   a control unit controlling a plurality of components of an optical telecommunications network;
   a plurality of components of the optical telecommunications network, each component comprising at least one managed entity of the optical telecommunications network, each managed entity representing a facility or service of the optical telecommunications network; and
   a database comprising information relating to the managed entities, wherein the database is distributed by storing a portion of the database in the control unit and storing a portion of the database in each of the plurality of components of the optical telecommunications network.

2. The system of claim 1, wherein the portion of the database that is stored in the control unit comprises a plurality of proxy entries, each proxy entry relating to a managed entity, wherein each proxy entry points to an entry, in a portion of the database that is stored in a component of the optical telecommunications network, relating to the managed entity.

3. The system of claim 2, wherein the portion of the database that is stored in the component of the optical telecommunications network comprises a plurality of entries, each entry relating to a managed entity on the component of the optical telecommunications network.

4. The system of claim 3, wherein the control unit is operable to, upon receipt of a request directed to a managed entity, obtain an entry in a portion of the database that is stored in the control unit related to the managed entity and to send the request to an entry relating to the managed entity on a component of the optical telecommunications network.

5. A method for managing a telecommunications network comprising:

controlling a plurality of components of an optical telecommunications network with a control unit;
operating a plurality of components of the optical telecommunications network, each component comprising at least one managed entity of the optical telecommunications network, each managed entity representing a facility or service of the optical telecommunications network; and
distributing a database comprising information relating to the managed entities by storing a portion of the database in the control unit and storing a portion of the database in each of the plurality of components of the optical telecommunications network.

6. The method of claim 5, further comprising:
arranging the portion of the database that is stored in the control unit to comprise a plurality of proxy entries, each proxy entry relating to a managed entity, wherein each proxy entry points to an entry, in a portion of the database that is stored in a component of the optical telecommunications network, relating to the managed entity.

7. The method of claim 6, further comprising:
arranging the portion of the database that is stored in the component of the optical telecommunications network to comprise a plurality of entries, each entry relating to a managed entity on the component of the optical telecommunications network.

8. The method of claim 7, further comprising:
upon receipt of a request directed to a managed entity, obtaining an entry in a portion of the database that is stored in the control unit related to the managed entity and sending the request to an entry relating to the managed entity on a component of the optical telecommunications network.

9. An optical telecommunications network system comprising:
   a plurality of components of a plurality of components of the optical telecommunications network, each of the plurality of components including at least one managed entity representing a facility or service of the optical telecommunications network;
   a control device controlling a plurality of components of the optical telecommunications network, the control device comprising a portion of a database including information relating to the managed entities, the portion of the database comprising at least one parent node relating to each of at least a portion of the managed entities, wherein each parent node includes a pointer to at least one child node including a portion of the database including information relating to the managed entity;
   wherein, each of the plurality of components of the optical telecommunications network stores the child node including the portion of the database including the information relating to the managed entity included in the component.

10. The system of claim 9, wherein the plurality of components of the optical telecommunications network comprise at least one optical network unit and at least one optical line termination.

11. The system of claim 10, wherein the optical telecommunications network comprises a passive optical network.

* * * * *